United States Patent [19]
Cowles

[11] Patent Number: 6,094,388
[45] Date of Patent: Jul. 25, 2000

[54] METHODS OF IDENTIFYING DEFECTS IN AN ARRAY OF MEMORY CELLS AND RELATED INTEGRATED CIRCUITRY

[75] Inventor: Timothy B. Cowles, Boise, Id.

[73] Assignee: Micron Technology, Inc., Boise, Id.

[21] Appl. No.: 09/346,370

[22] Filed: Jul. 1, 1999

[51] Int. Cl.[7] .................................................. G11C 7/00
[52] U.S. Cl. ......................................... 365/201; 365/190
[58] Field of Search ..................................... 365/201, 190

[56] References Cited

U.S. PATENT DOCUMENTS 5,848,018 12/1998 McClure ................................. 365/201

*Primary Examiner*—David Nelms
*Assistant Examiner*—M. Tran
*Attorney, Agent, or Firm*—Wells, St. John, Roberts, Gregory & Matkin, P.S.

[57] ABSTRACT

Methods of identifying defects in an array of memory cells and related integrated circuitry are described. In one embodiment, an array of memory cells is provided having a plurality of complementary digit line pairs. The digit line pairs comprise individual digit lines $D0_n$, $D0_n{}^*$, where n>1. The complementary digit line pairs are configured to be placed into different states during sensing operations of the array. A defect-identifying signal is applied to the array by driving both digit lines of at least one digit line pair to a common test state, and the cell plate to another different test state with the use of only one dedicated bus line. In another embodiment, a pair of memory cells is provided each having an access transistor and a capacitor. The capacitor has a cell plate. Write circuitry is operably coupled with the pair of memory cells through respective individual input lines. The write circuitry is configured to write data into the memory cells. A defect-identifying condition is imposed on the array by placing the cell plate into a first test state, and, using the write circuitry, placing both of the input lines into a common second test state which is different from the first test state.

32 Claims, 12 Drawing Sheets

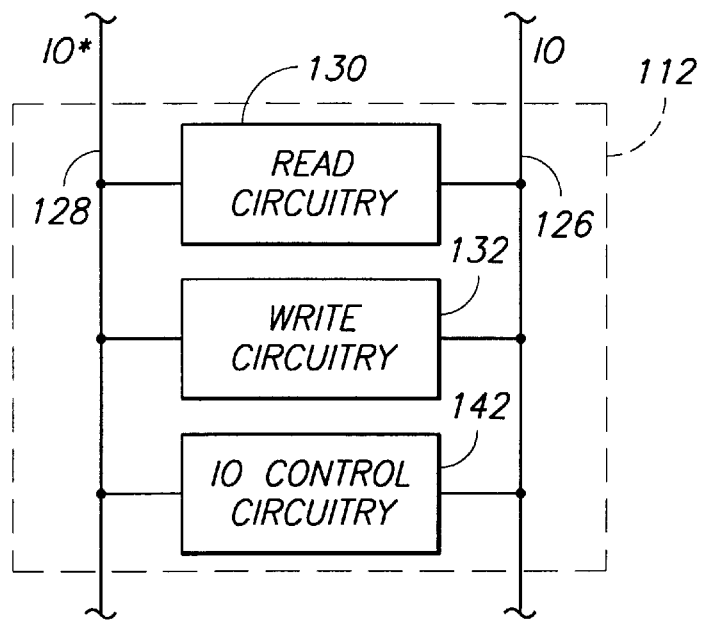
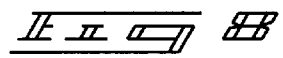
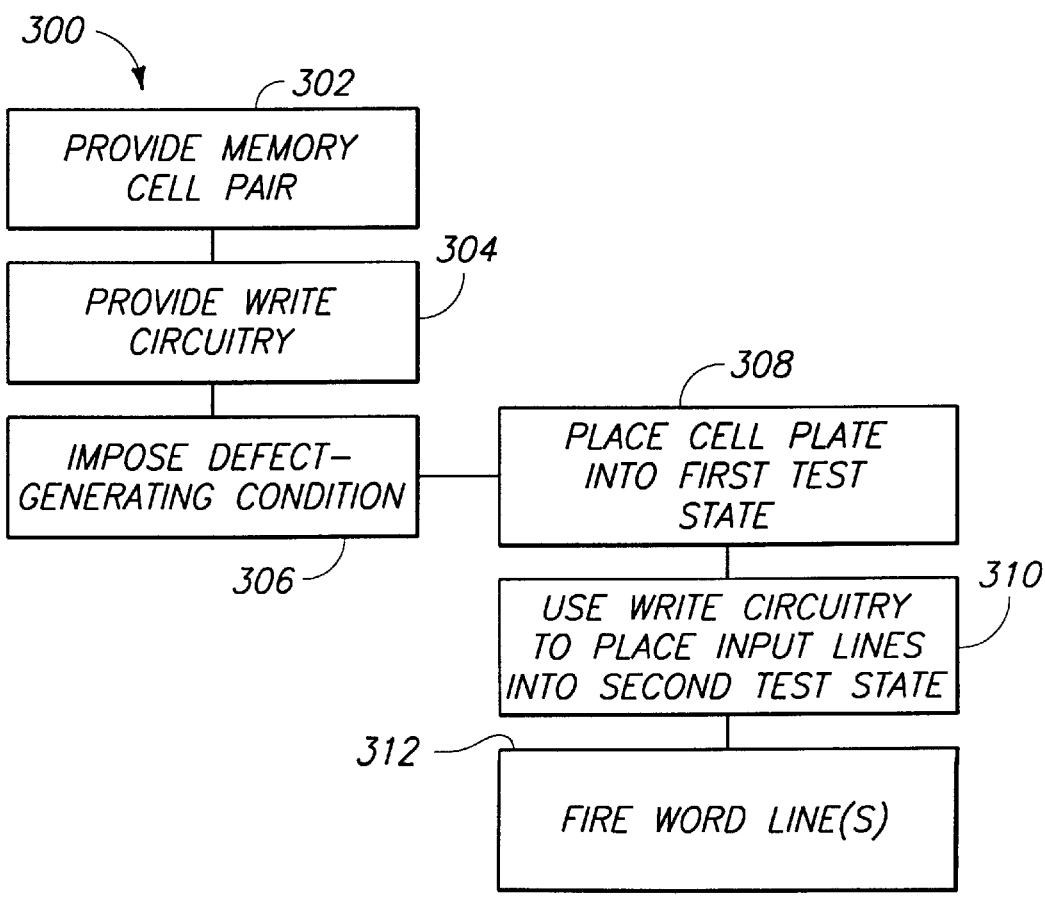
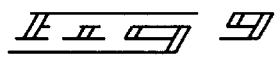

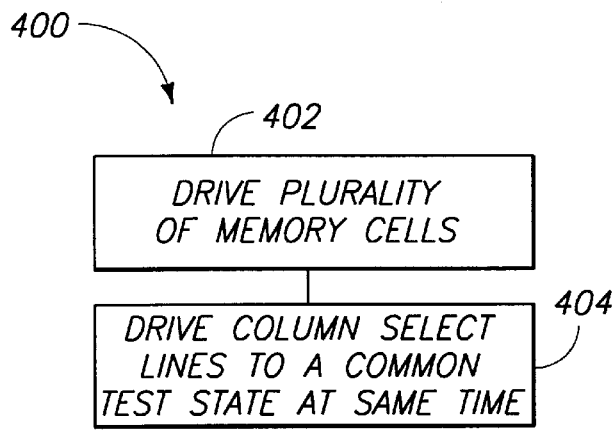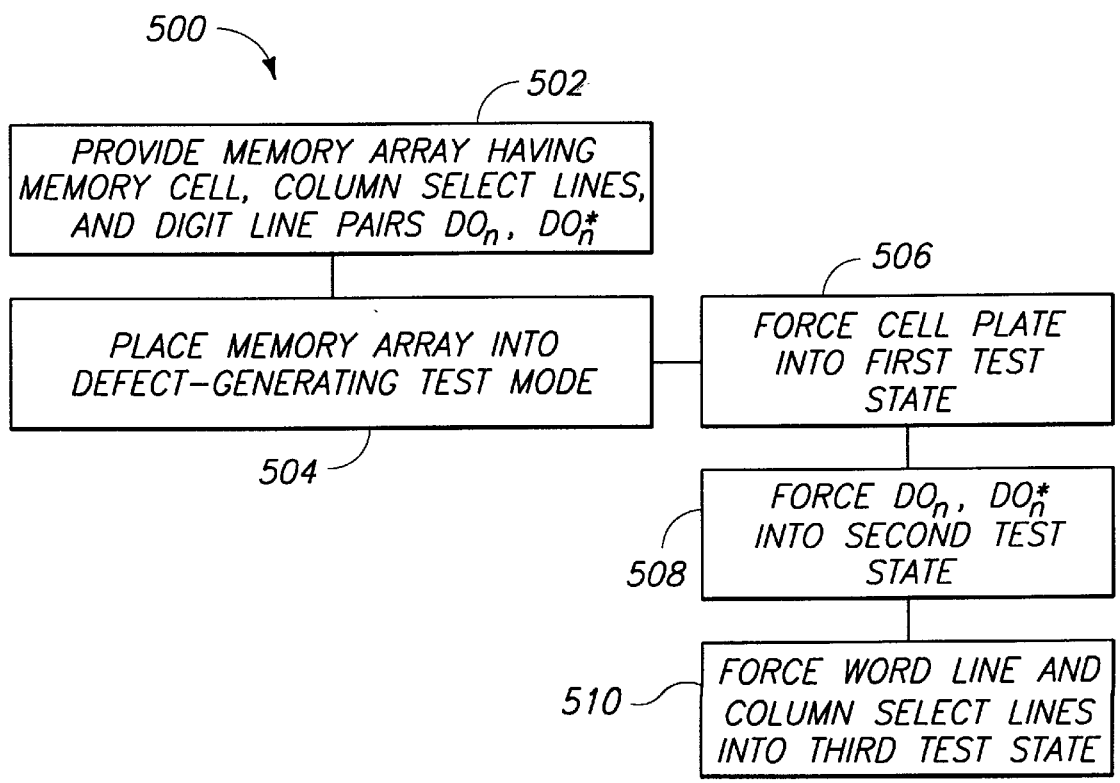

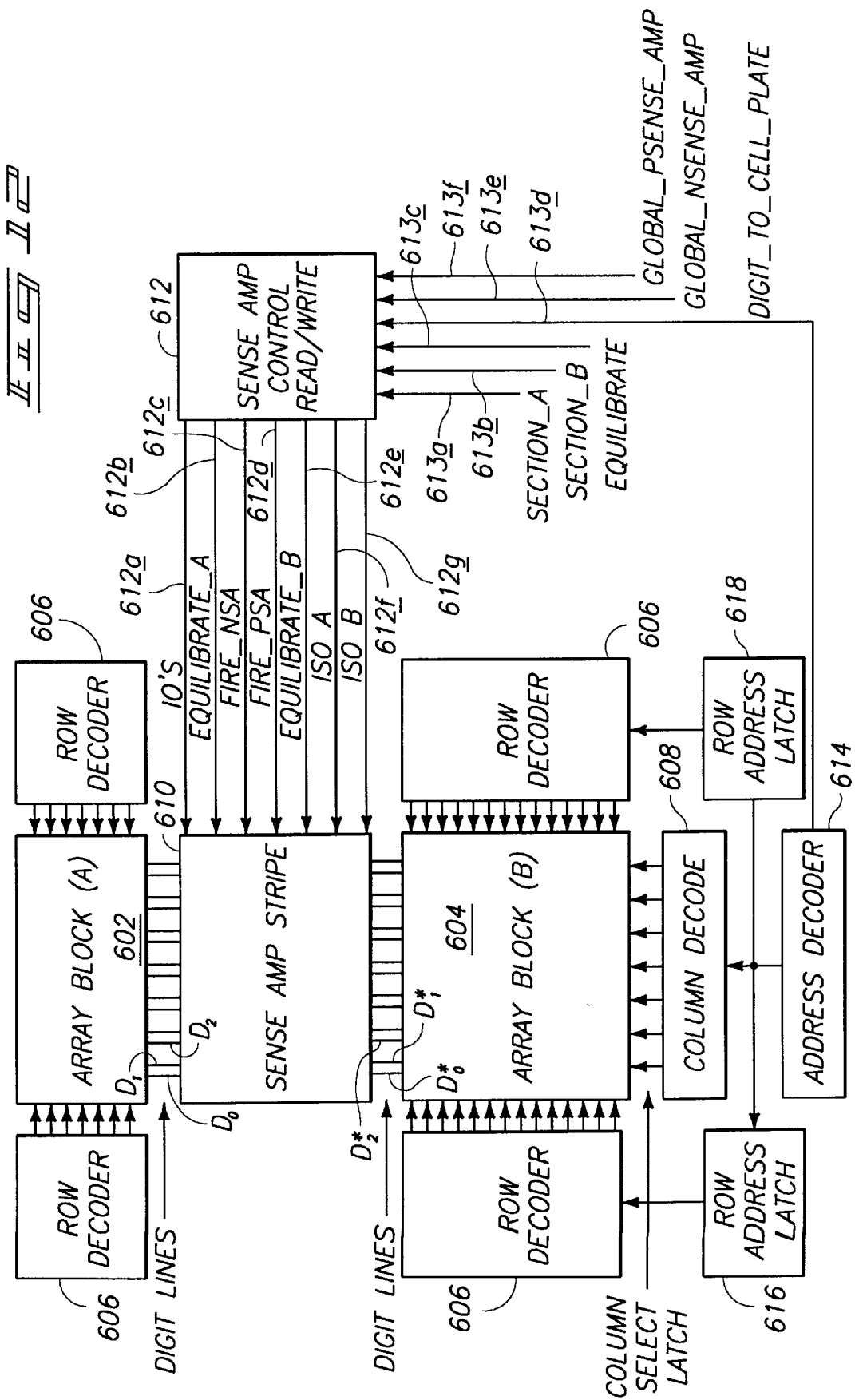

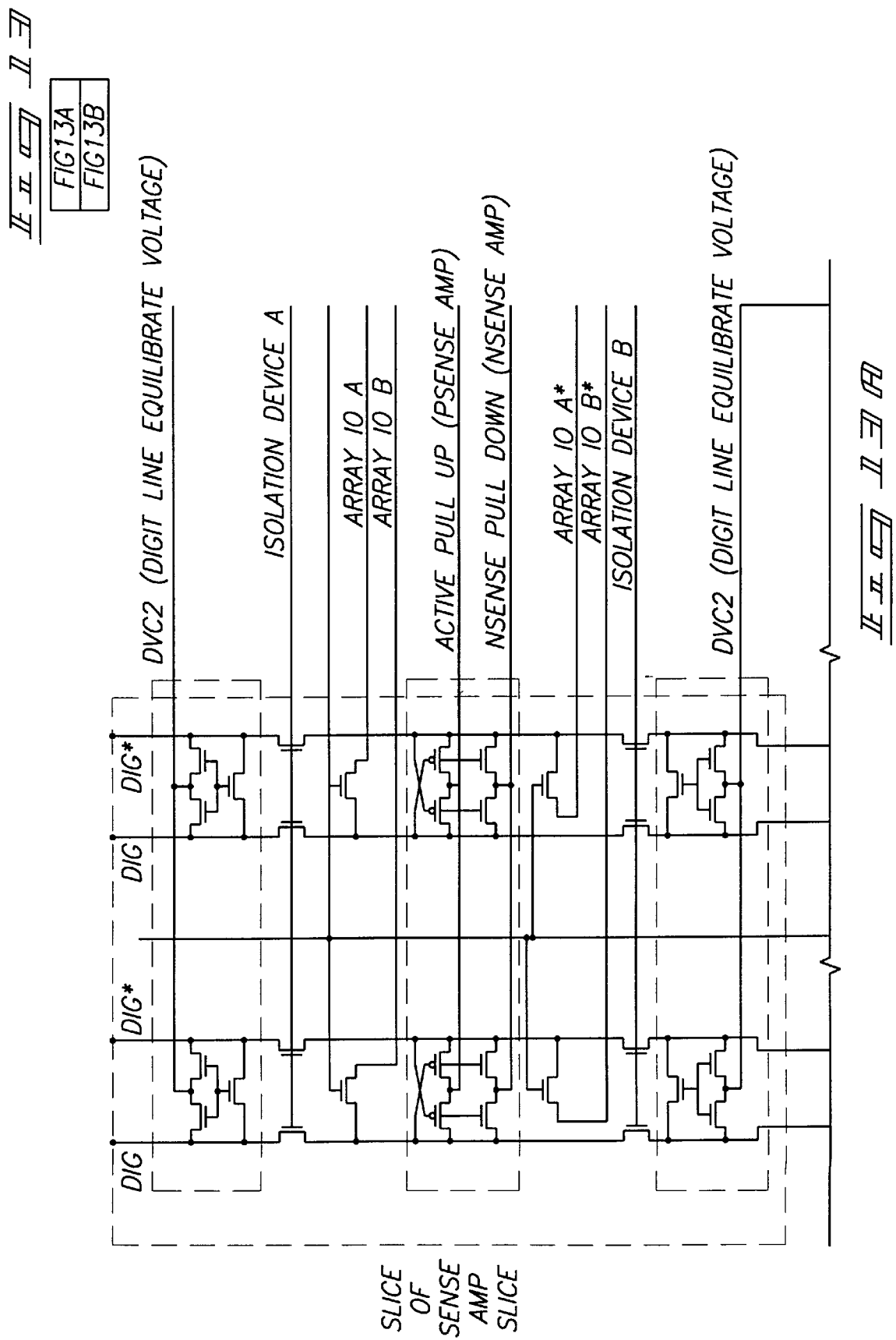

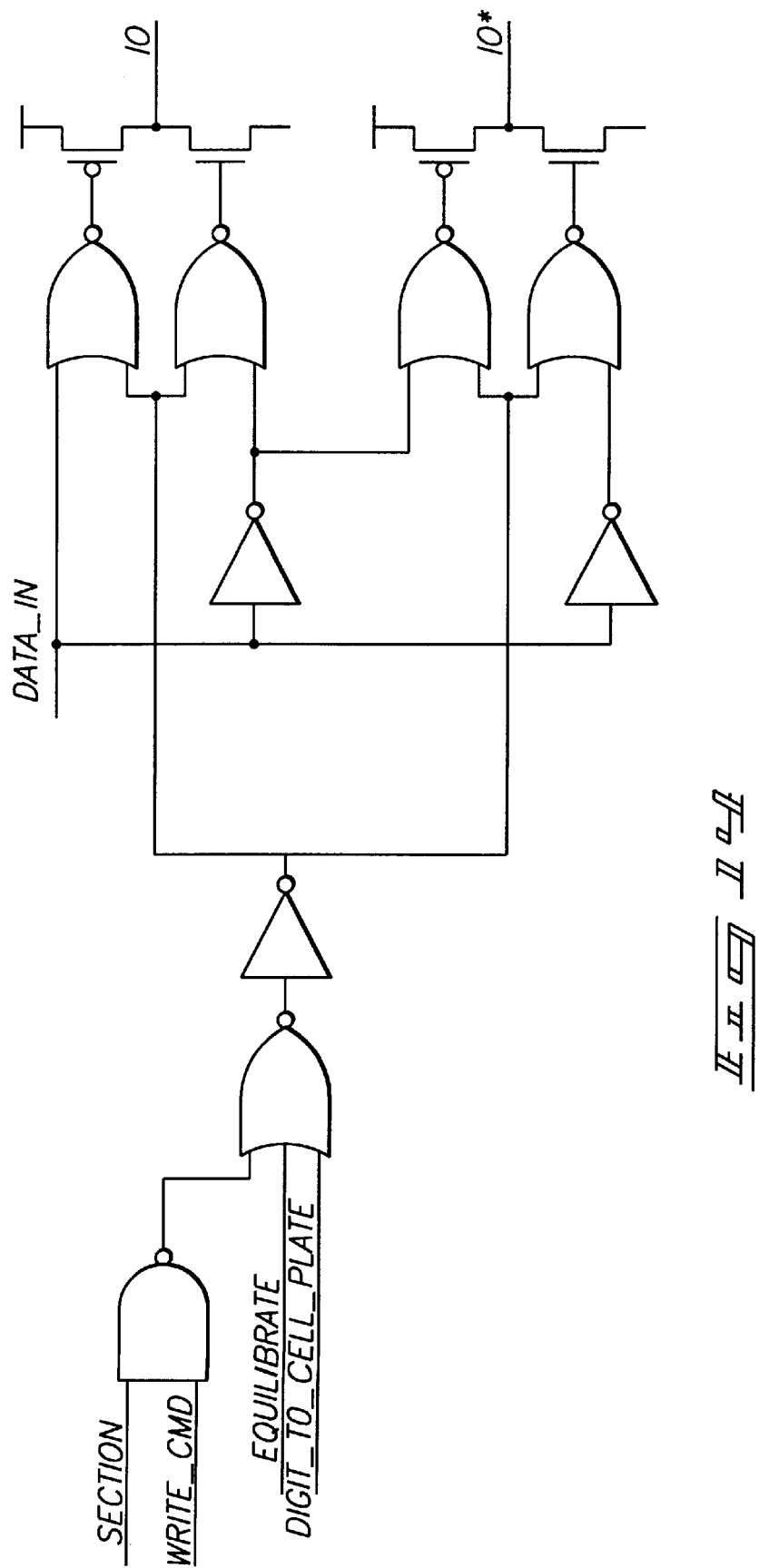

ns
6,094,388

METHODS OF IDENTIFYING DEFECTS IN AN ARRAY OF MEMORY CELLS AND RELATED INTEGRATED CIRCUITRY

TECHNICAL FIELD

This invention pertains to methods of identifying defects in arrays of memory cells, and to related integrated circuitry.

BACKGROUND OF THE INVENTION

Fabrication of memory array circuitry involves a number of complex processing steps. It is highly desirable to test such circuitry for defects prior to providing a finished product for the customer. Undetected defects can be highly problematic in finished integrated circuitry because of the increased likelihood of erroneous output data.

To assist in understanding the various embodiments of the invention described below, some background information is provided in connection with FIGS. 1 and 2.

FIG. 1 shows an exemplary portion of memory array circuitry generally at 20. Circuitry 20 comprises a semiconductive substrate 22 having a plurality of field oxide regions 24 formed thereover. Individual diffusion regions 26 are provided within substrate 22. A plurality of word lines 28 are provided over the substrate and typically include a polysilicon layer 30, a silicide layer 32, overlying insulative cap 34, and sidewall spacers 36. Individual capacitor constructions are provided at 38 and include conductive storage nodes 40, a dielectric layer 42, e.g. an ONO layer, and a cell plate layer 44. A bit line 46 is disposed over capacitors 38 and is operably connected with its associated diffusion region 26 through a bit line contact 48. This type of memory circuitry is known as bit line-over-capacitor circuitry. One common failure or defect which can occur in this type of circuitry is for the bit line 46 to become short circuited to cell plate layer 44. Such can occur, for example, in an area designated at A when a sufficient voltage causes the dielectric layer separating these components to break down in a manner which is similar to that of an antifuse.

Another type of memory array circuitry is shown in FIG. 2 generally at 20a. Like numerals from the above-described memory circuitry have been utilized where appropriate with differences being indicated by the suffix "a". This type of memory array circuitry is known as capacitor-over-bit line circuitry. As shown, individual capacitors 38a are disposed over bit line 46a. A typical failure or defect which can occur in this type of memory array circuitry is a word line-to-bit line short circuit. Specifically, such can occur in the area designated at B.

The defects of concern might not inherently be created or perceptible during normal operation, but potentially can exist or can be created later during so-called burn-in operations. This could result from a less than desirable spacing between the respective components which can become short circuited together. In the past, methods have evolved for stress testing such circuitry, but such methods have fallen short of providing either or both of time savings or wafer real estate savings.

One method which has been utilized to achieve defect identification involves the fabrication of a plurality of dedicated bus lines which are configured to provide test voltages across the memory array. For example, and with respect to FIG. 1 where defects can occur if bit line 46 becomes short circuited to cell plate 44, these plural dedicated bus lines have been utilized to force a voltage differential between the bit line and the cell plate so as to cause a breakdown in possibly defective insulative material separating the two. One primary disadvantage of this method is that it requires several dedicated bus lines to be formed over the semiconductor wafer which supports the memory circuitry. This is problematic from the standpoint of undesirably consuming wafer real estate, i.e. it undesirably increases the die size which decreases the die per wafer, which would otherwise be available to support additional memory circuitry.

Another method which has been utilized in the past involves utilizing circuitry which already exists on the substrate. Specifically, and with respect to FIG. 1, a voltage differential can be developed between cell plate 44 and bit line 46 by taking one of the two to a high potential, and the other of the two to a low potential. Essentially problematic with this approach with respect to memory circuitry, and in particular DRAM circuitry which uses a so-called complimentary bit line or digit line construction, is that the bit lines/digit lines are hard wired so that when one goes high, the other goes low. Accordingly, to adequately test all of the memory cells comprising a memory array, additional processing steps must be taken because of the complementary behavior of the digit line pairs. Needless to say, these additional processing steps consume valuable processing time and reduce throughput. For example, processing times can be increased from 2- to 8-times the processing time than if the entire array were able to be tested at once. Specifically, in one type of architecture which is discussed below in much more detail, the array utilizes complementary digit line pairs which are configured to assume complementary states. The digit line pairs typically extend from different array blocks. Because of the complementary nature of the digit line pairs, when one array block is tested by placing one of the digit lines of a digit line pair at a particular potential, the other digit line is not or cannot be tested. Hence, the array blocks must be separately tested.

Accordingly, this invention arose out of concerns associated with providing improved methods of testing integrated circuitry, and in particular memory array circuitry for defects. In particular, this invention arose out of concerns associated with providing testing procedures which save time, and related integrated circuitry which does not consume a meaningful amount of wafer real estate.

SUMMARY OF THE INVENTION

Methods of identifying defects in an array of memory cells and related integrated circuitry are described. In one embodiment, an array of memory cells is provided having a plurality of complementary digit line pairs. The digit line pairs comprise individual digit lines $D0_n$, $D0_n^*$, where n>1. The complementary digit line pairs are configured to be placed into different states during sensing operations of the array. A defect-identifying signal is applied to the array by driving both digit lines of at least one digit line pair to a common test state, and the cell plate to another different test state with the use of only one dedicated bus line.

In another embodiment, a pair of memory cells is provided each having an access transistor and a capacitor. The capacitor has a cell plate. Write circuitry is operably coupled with the pair of memory cells through respective individual input lines. The write circuitry is configured to write data into the memory cells. A defect-identifying condition is imposed on the array by placing the cell plate into a first test state, and, using the write circuitry, placing both of the input lines into a common second test state which is different from the first test state.

BRIEF DESCRIPTION OF THE DRAWINGS

Preferred embodiments of the invention are described below with reference to the following accompanying drawings.

FIG. 8 is a isolated schematic view of read/write circuitry in accordance with one embodiment of the invention.

FIG. 9 is a flow diagram which describes a defect-identifying method in accordance with one or more embodiments of the invention.

FIG. 10 is a flow diagram which describes a defect-identifying method in accordance with one or more embodiments of the invention.

FIG. 11 is a flow diagram which describes a defect-identifying method in accordance with one or more embodiments of the invention.

FIG. 12 is a high-level schematic block diagram of memory circuitry in accordance with one embodiment of the invention.

FIG. 13 is a view which describes the orientation of FIGS. 13a and 13b.

FIG. 13a is a view of peripheral circuitry in accordance with one embodiment of the invention.

FIG. 14 is a schematic view of control circuitry or override circuitry in accordance with one embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Prior to discussing various embodiments of the invention, a brief discussion of memory arrays is given for purposes of assisting in understanding the various embodiments.

Figure 1:
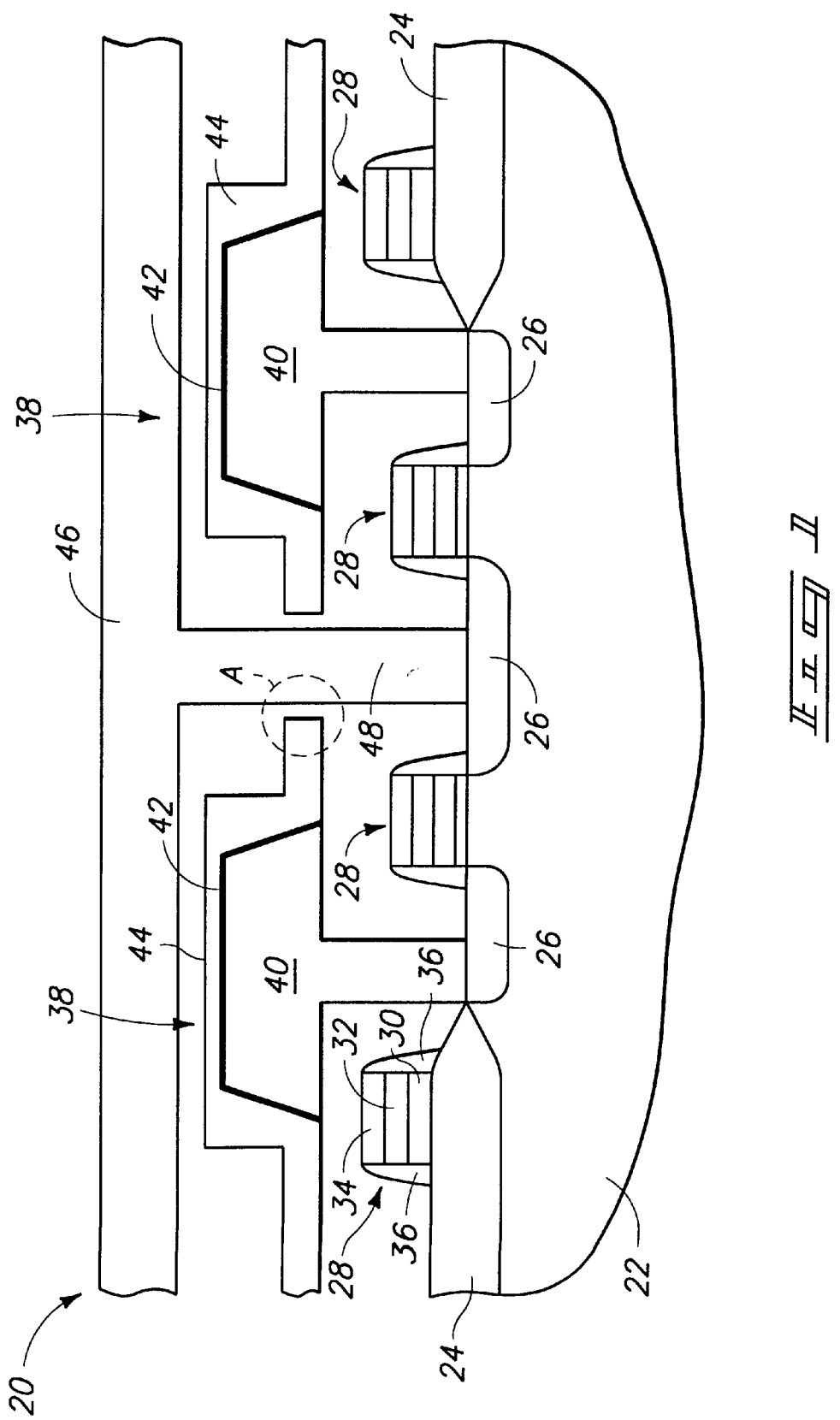
FIG. 1 is a diagrammatic side sectional view of a portion of memory array circuitry.
Figure 2:
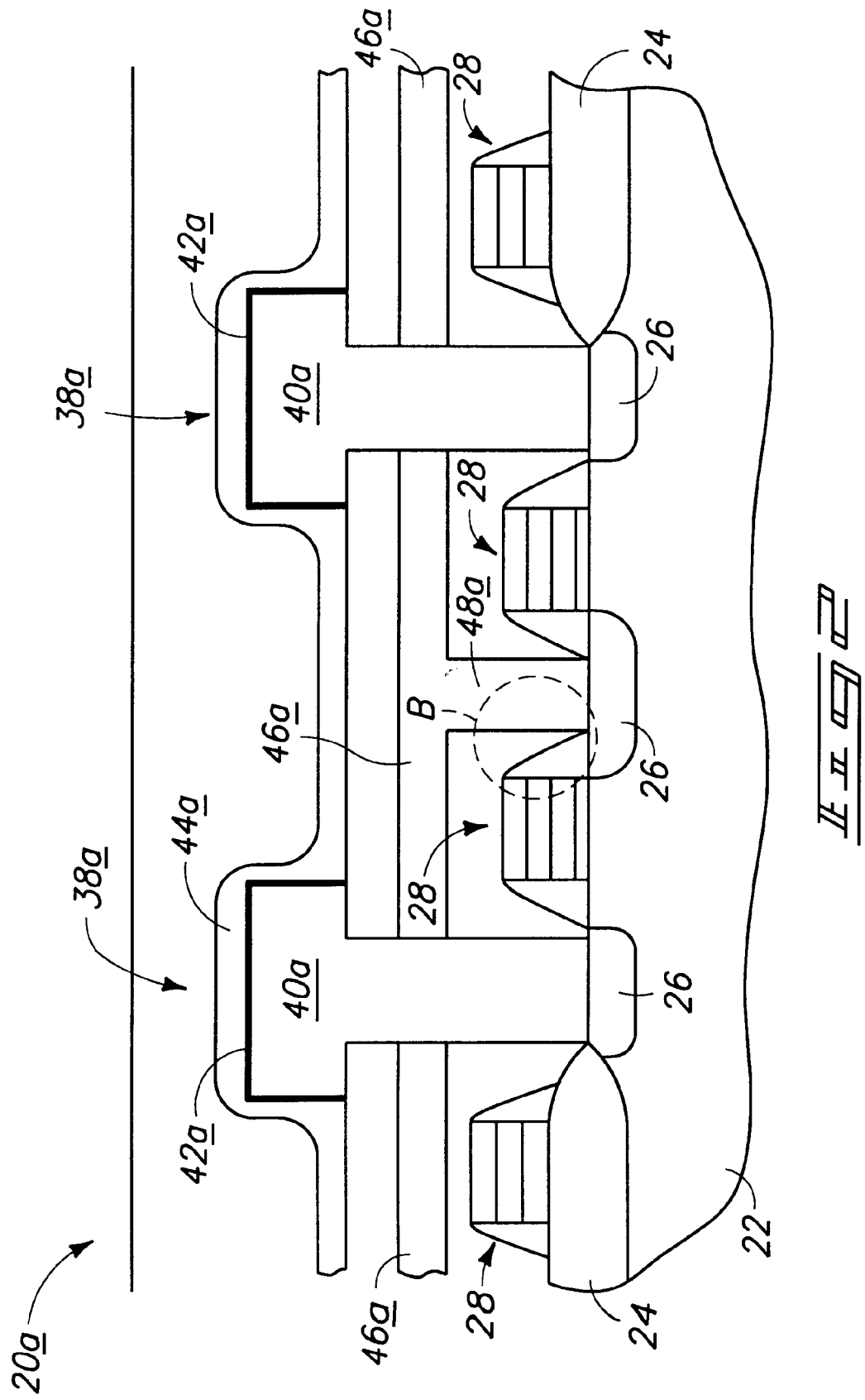
FIG. 2 is a diagrammatic side sectional view of a portion of memory array circuitry.
Figure 3:
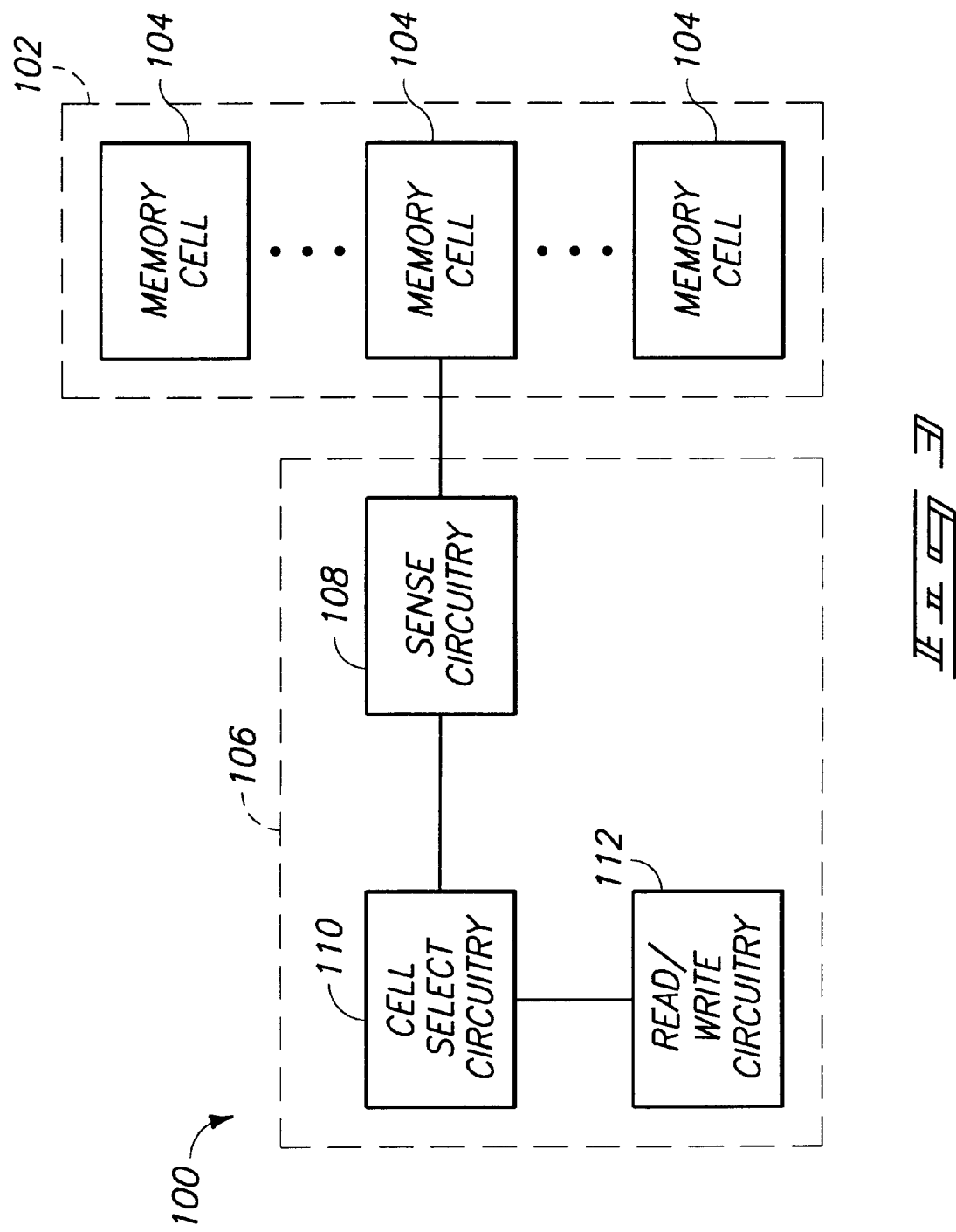
FIG. 3 is a high-level schematic view of a memory array and its related peripheral circuitry.

Referring to FIG. 3, integrated circuitry comprising a memory array and its associated peripheral circuitry is shown generally at 100. Circuitry 100 includes a memory array 102 comprising individual memory cells 104. In the illustrated and preferred embodiment, memory cells 104 are a part of a dynamic random access memory (DRAM) memory array and accordingly, each comprise an individual transistor and an individual capacitor. Peripheral circuitry 106 is provided and is coupled with memory array 102. Circuitry 106 includes, in this example, sense circuitry 108, cell select circuitry 110, and read/write circuitry 112.

Sense circuitry 108 is coupled with memory array 102 and performs sensing operations relative to the individual memory cells 104. Cell select circuitry 110 enables one or more memory cells 104 to be selected or addressed for read/write operations. Read/write circuitry 112 is operable to provide reading and writing functions relative to memory array 102.

Figure 4:
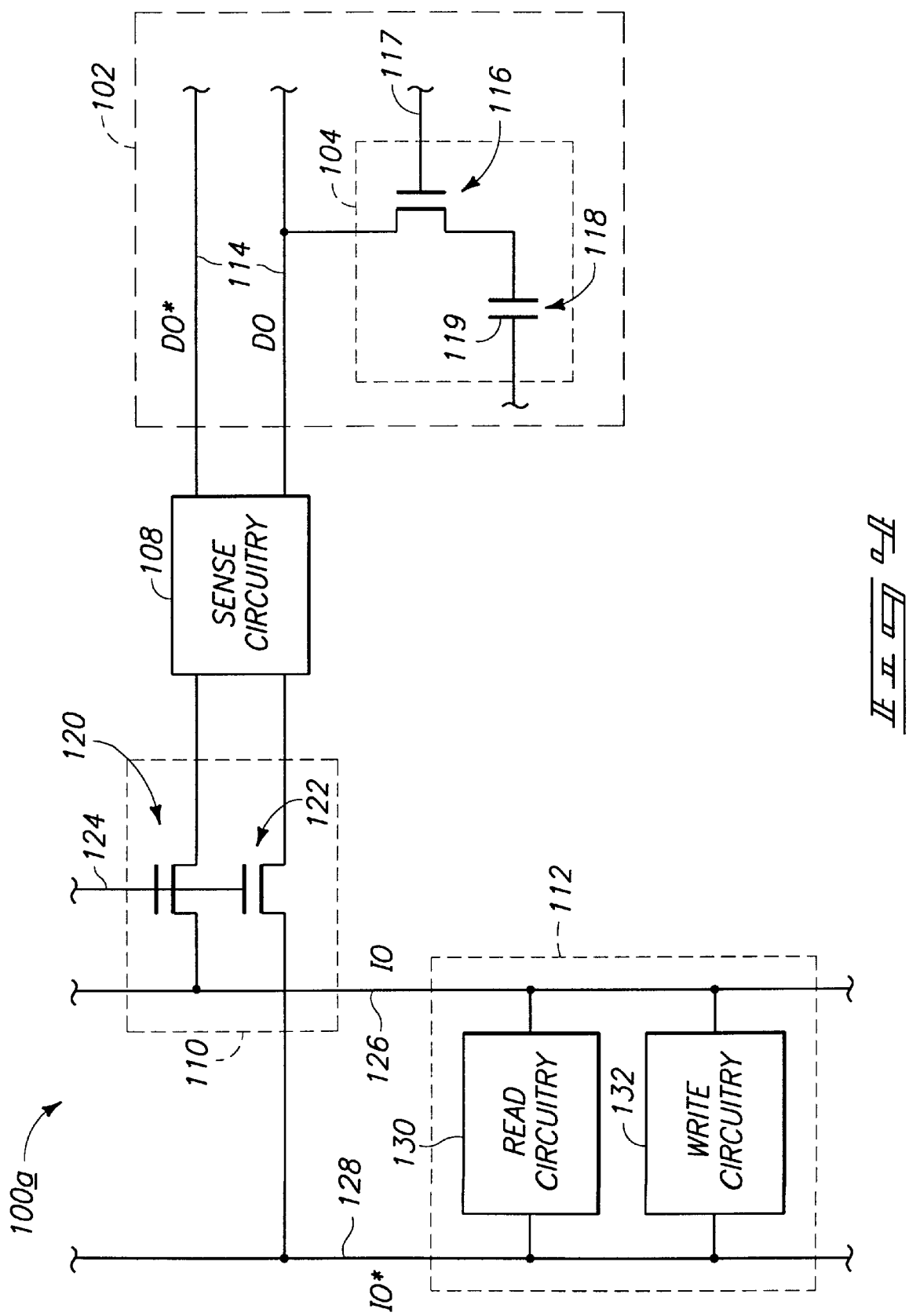
FIG. 4 is a schematic which is similar to that which is shown in FIG. 3, only one which shows more detail.

Referring to FIG. 4, a more detailed schematic of the FIG. 3 circuitry is shown generally at 100a. Like numerals from the above-described embodiment have been utilized where appropriate, with differences being indicated by the suffix "a" or with different numerals.

Preliminarily, and in this example, circuitry 100a comprises a memory array 102 which is configured with complementary digit line pairs, an exemplary one of which being shown at 114. The digit line pair comprises digit line D0 and digit line D0*. Memory cell 104 includes a transistor 116 which is known as an access transistor and a capacitor 118 coupled with transistor 116. Transistor 116 is gated by a word line 117. Capacitor 118 includes two plates, one of which being designated at 119 and comprising a common cell plate which is shared with all of the memory cells across the array. The other capacitor plate is not specifically designated, but comprises a storage node of the capacitor. Digit line D0 is coupled with capacitor 118 through access transistor 116. Digit line D0* is coupled with a memory cell in an adjacent memory cell block. Capacitor 118 enables charge to be stored which, when stored, is representative of a logic state "1" or "0". Sense circuitry 108 is coupled with digit line pair 114 and performs sensing operations which are described in more detail below in connection with FIG. 6.

Cell select circuitry 110, in this example, includes transistors 120, 122 which are individually gated by a column select (CSel) line 124. A pair of complementary IO lines 126, 128 (designated as IO and IO* respectively) are provided and are operably connected with transistors 120, 122 respectively. The IO lines 126, 128 connect with read/write circuitry 112 which, in this example, includes individual read circuitry 130, and individual write circuitry 132.

Typically, during operations, a charge, representing either a logic "1" or a logic "0" is stored on capacitor 118. To sense or determine the stored charge, the digit line pair 114 is equilibrated by an equilibration circuit (not specifically shown in FIG. 4) so that each is maintained at a common potential. Word line 117 fires thereby dumping the charge stored on capacitor 118 onto digit line D0. The sense circuitry 108 is then fired which, in accordance with this example, pulls one digit line to Vcc, and the other digit line to ground. Column select line 124 then fires which activates transistors 120, 122 which, in turn, passes the digit line potentials onto IO lines 126, 128 respectively, and then to read/write circuitry 112 for processing.

Sensing which is accomplished by sense circuitry 108, is essentially an amplification of the digit line signal (the differential voltage between the individual digit lines). Sensing is necessary to properly read the cell data and to refresh the memory cells. Sensing operations are performed by sense circuitry 108 described in more detail below in connection with FIG. 6. Data is also written to capacitor 118 by write circuitry 132. A write operation is similar to the sensing and restore operations, except that a separate write driver circuit determines what data is placed into the cell. An exemplary write driver circuit comprises a tristate inverter connected to the digit lines through a pair of pass transistors (transistors 120, 122). The column select (CSel) signal is decoded from the column address to select which pair (or multiple pairs) of digit lines is (are) routed to an output pad or, in this case, the write driver.

In many DRAM designs, the write driver simply overdrives the sense circuitry 108, which remains on during writing operations. After the new data is written into the sense amplifiers, the amplifiers finish the write cycle by restoring the digit lines to full rail-to-rail voltages.

Figure 5:
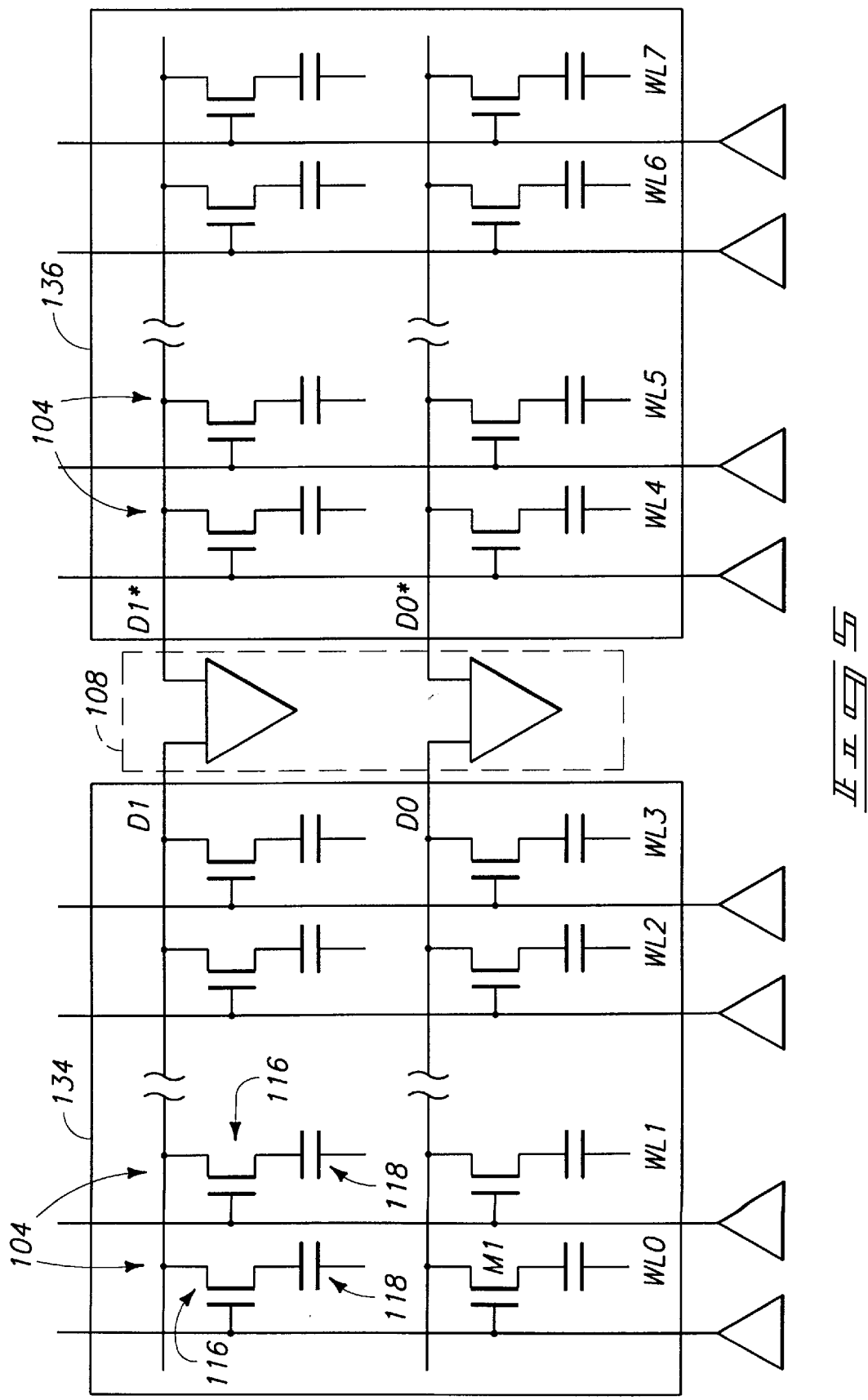
FIG. 5 is a schematic view of two memory blocks comprising individual memory cells.

Referring to FIG. 5, two different array blocks 134, 136 are shown. Array blocks 134, 136 each contain a plurality of individual memory cells 104, only some of which are labeled. Blocks 134, 136 constitute an array of memory cells. Individual memory cells 104 have their access transistors 116 gated by individual word lines (row lines) designated as WL0, WL1 . . . WL7. The individual access transistors are also operably connected to a respective digit line (column line) designated as D0, D0*, D1, D1*. Accordingly, complementary digit line pairs are seen to be provided by digit lines D0, D0*, and D1, D1* respectively. The digit line pairs are coupled with sense circuitry 108 for sensing operations described just below.

Figure 6:
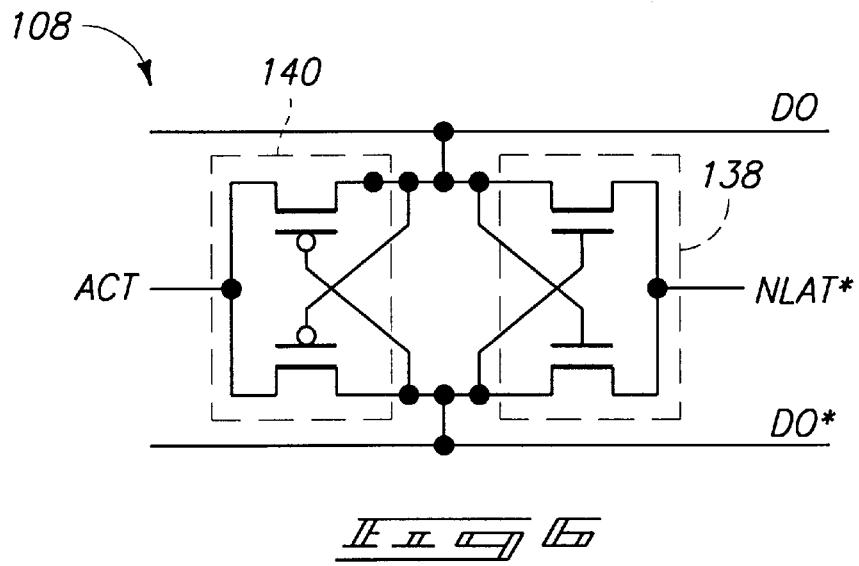
FIG. 6 is a circuit diagram of exemplary sense circuitry.

Referring to FIG. 6, an exemplary schematic of sense circuitry 108 is shown. Sense circuitry 108 includes a cross-coupled NMOS pair of transistors 138, and a cross-coupled PMOS pair of transistors 140. NMOS pair 138, also referred to as an Nsense amplifier, has a common node labeled NLAT*, for "Nsense amp latch". Similarly, PMOS pair 140, also referred to as a Psense amplifier, has a common node labeled ACT, for "active pull up".

In operation, NLAT* is biased to Vcc/2, and ACT is biased to Vss or signal ground. Because the digit line pair D0 and D0* are both initially equilibrated at, for example, Vcc/2, both transistors of NMOS pair 138 are off. Similarly, both transistors of PMOS pair 140 are off. When a memory cell is accessed, a signal develops across the digit line pair D0, D0*. While one digit line contains charge from the accessed cell, the other digit line does not and serves as a reference for the sensing operation. The sense amplifiers are generally fired sequentially, with the Nsense amp 138 being fired first, followed by the Psense amp 140. The Nsense amp 138 is fired by bringing NLAT* toward ground. As the voltage difference between NLAT* and the digit lines approaches the threshold voltage, the NMOS transistor whose gate is connected to the higher voltage digit line begins to conduct. This conduction occurs first in the subthreshold region and then in the saturation region as the gate-to-source voltage exceeds the threshold voltage. This conduction causes the low-voltage digit line to be discharged toward the NLAT* voltage. Ultimately NLAT will reach ground, and the digit line will be brought to ground potential. Note that the other NMOS transistor will not conduct; its gate voltage is derived from the low-voltage digit line which is being discharged towards ground.

With one typical approach, sometime after Nsense amp 138 fires, ACT will be brought toward Vcc and activate the Psense amp, which operates in a complementary fashion to the Nsense amp. With the low-voltage digit line approaching ground, there is a strong signal to drive the appropriate PMOS transistor into conduction. This conduction, again moving from subthreshold to saturation, charges the high-voltage digit line toward ACT, ultimately reaching Vcc, in one embodiment. Because the access transistor of the memory cell remains on, the memory cell capacitor is refreshed during the sensing operation. The voltage, and hence the charge, which the capacitor held prior to accessing, is restored to a full level—Vcc for a logic 1, and ground for a logic 0. In an alternative embodiment, conduction to full rail voltages is not required; for example, instead of charging between ground and Vcc, a range between any two particular voltages can be employed. For example, a range between ground and Vcc/2 can be employed.

Having described various operational aspects of the subject memory circuitry, various embodiments of the invention are described just below.

Figure 7:
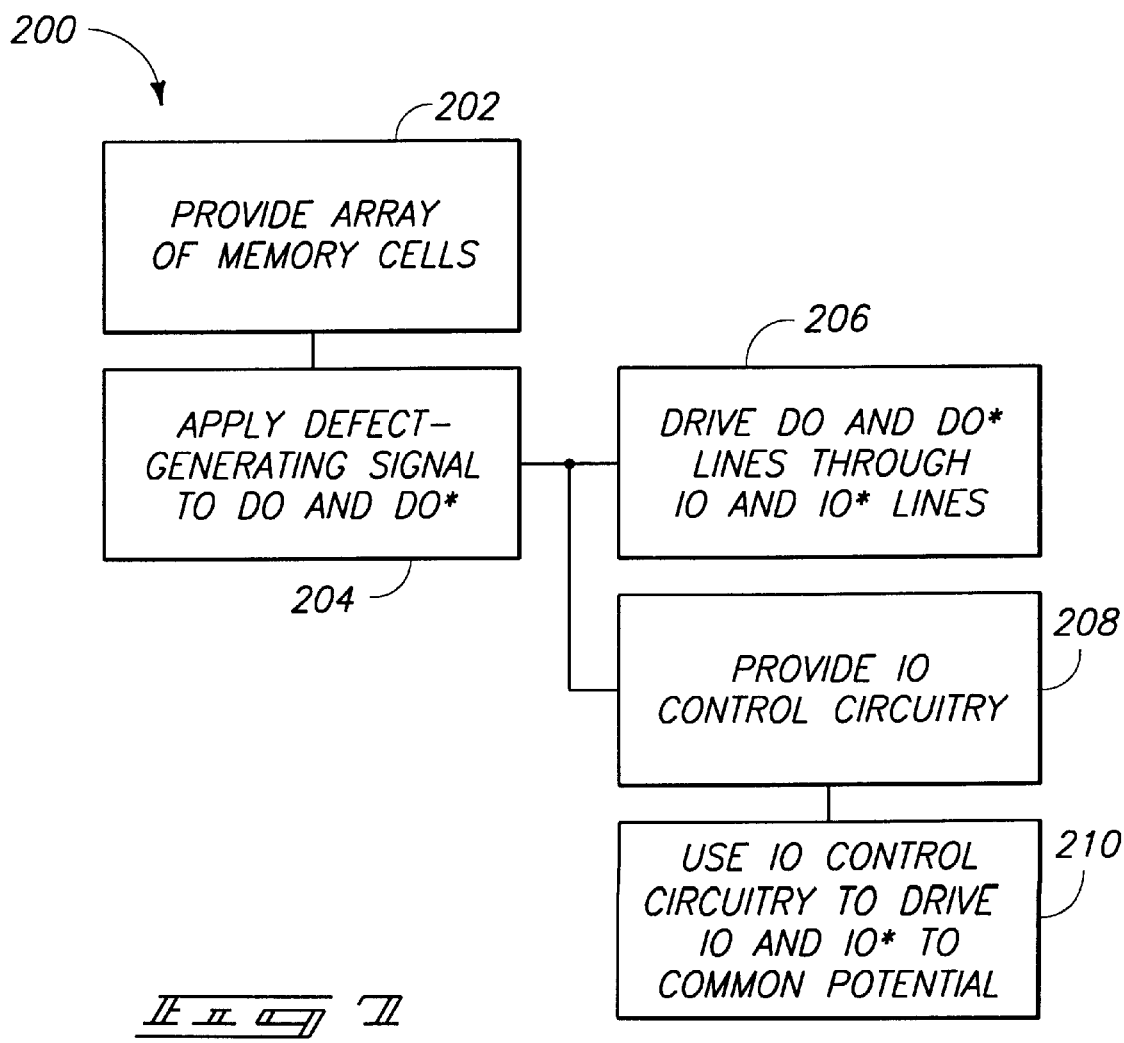
FIG. 7 is a flow diagram which describes a defect-identifying method in accordance with one or more embodiments of the invention.

Referring to FIG. 7, a flow diagram illustrating one or more embodiments of the current invention is shown generally at 200. The method shown at 200 describes defect-identifying methods suitable for use in or with an array of memory cells. At 202, an array of memory cells is provided having a plurality of complementary digit line pairs comprising individual digit lines $D0_n$, $D0_n^*$, where n>1. The complementary digit line pairs are configured to be placed into different states during sensing operations of the array as described above. At 204, a defect-identifying signal is applied to the array by driving the digit lines $D0_n$, $D0_n^*$ of at least one of the digit line pairs, and preferably a plurality or all of the digit line pairs, to a common test state, and the cell plate to another different test state, with the use of only one dedicated bus line. One exemplary embodiment which can be used to place the digit lines into the common test state is shown in FIGS. 12–14 and discussed in more detail below. Use of only one dedicated bus line to effect the placement of the digit lines into the desired test state constitutes an improvement over prior methods which required a plurality of dedicated bus lines to do so.

In one embodiment, read/write circuitry, such as circuitry 112 in FIG. 4, is provided and operably coupled to the plurality of complementary digit line pairs through respective $IO_m$ and $IO_m^*$ lines, where M>1. Exemplary IO lines for one digit line pair are shown at 126, 128 respectively. In this embodiment, the digit lines of at least one digit line pair, and preferably a plurality or all of the digit line pairs, are driven to the common test state, at 206 (FIG. 7), through their respective $IO_m$ and $IO_m^*$ lines.

Referring to FIGS. 7 and 8, and in accordance with another embodiment of the invention, IO control circuitry 142 (FIG. 8) is provided at 208, and is operably coupled with IO lines 126, 128 respectively. The IO circuitry is preferably used to drive the IO and IO* lines to a common potential, at 210, which is preferably passed onto individual respective digit line pairs, e.g. digit line pair 114. The IO control circuitry can take many forms, with but one exemplary circuit being shown in FIG. 14 which is discussed in more detail below. In this example, IO control circuitry comprises logic circuitry in the form of combinational logic elements which are arranged to impart the above-described functionality. It will be apparent to those of skill in the art that different types of circuits, including combinational logic circuits, can be used to implement various embodiments of the invention without departing from the spirit and scope of the invention.

Referring to FIGS. 4, 7, and 8, and in accordance with another embodiment of the invention, write circuitry 132 is provided and is operably coupled to complementary digit line pair 114 through individual respective IO lines 126, 128. Lines 126, 128 are individually coupled to their respective digit lines through IO transistors 120, 122 respectively. In this embodiment, the digit lines are driven to the common test state by driving IO lines 126, 128 to a common potential and firing or activating IO transistors 120, 122 which are coupled to the individual digit lines of digit line pair 114. In a preferred embodiment, the various IO transistors of the array are gated by individual column select (CSel) lines. The IO transistors are fired by driving some, and preferably all of the column select (CSel) lines to a common potential.

Referring to FIG. 9, a flow diagram is shown generally at 300 and describes various inventive defect-identifying methods in accordance with other embodiments of the invention.

At 302, a pair of memory cells is provided, each having an access transistor and a capacitor. One exemplary memory cell of a suitable memory cell pair is shown at 104 in FIG.

4. Write circuitry is provided at 304 and is operably coupled with the pair of memory cells through respective individual input lines. In this example, the respective individual input lines are shown in FIG. 4 at 126, 128 respectively. Write circuitry 132 is preferably configured to write data into the memory cells. At 306, a defect-identifying condition is imposed on the array by placing cell plate 119 (FIG. 4) into a first test state at 308. Using write circuitry 132, both of the input lines 126, 128 are placed into a second test state, at 310, which is different from the first test state.

In one embodiment, the first test state comprises a first potential or voltage potential and the second test state comprises a second potential or voltage potential which is higher than the first potential. In one example, the cell plates can be grounded and the input lines can be taken to Vcc. The opposite is, of course, possible. In addition, variations in the applied potentials can occur.

In another embodiment, the input lines are respectively coupled with individual digit lines of a complementary digit line pair, e.g. digit line pair 114 in FIG. 4, and the second test state is passed onto the individual digit lines of the digit line pair. In a preferred embodiment, input lines 126, 128 are coupled with their respective individual digit lines through respective pass transistors which, in FIG. 4, are designated at 120, 122 respectively. The pass transistors are preferably gated by a column select (CSel) line. Passing of the second test state onto the digit lines comprises firing the column select (CSel) line. Firing the column select (CSel) line activates the individual pass transistors 120, 122 which, in turn, passes the test state on lines 126, 128 to their respective digit lines.

In another embodiment, a plurality of pairs of memory cells are provided. Write circuitry is operably coupled with a plurality of pairs of memory cells through a plurality of respective individual input lines. The respective individual input lines are respectively coupled with individual digit lines of a plurality of complementary digit line pairs. Preferably, the second test state is passed onto all of the individual digit lines. In a preferred embodiment, the input lines are coupled with their respective individual digit lines through respective pass transistors which are gated by individual column select (CSel) lines. The passing of the second test state comprises firing all of the column select lines for the array.

In another embodiment, the imposition of the defect-identifying condition comprises firing all of the word lines, at 312, associated with the pair of memory cells during at least a portion of the time when the input lines are placed into the common test state. This enables the test state to be provided onto the storage node of capacitor 118 (FIG. 4) which is disposed opposite of cell plate 119.

Referring to FIG. 10, a flow diagram describing other embodiments of the invention is shown generally at 400.

At 402, a plurality of memory cells are provided which are selectable by different column select (CSel) lines. The different column select lines are driven, at 404, to a common test state at the same time. Preferably, all of the column select (CSel) lines are driven to the common test state at the same time. In one embodiment, the memory cells each comprise a common cell plate, such as cell plate 119 in FIG. 4. The memory cells are preferably coupled to read/write circuitry 112 through individual pairs of IO, IO* lines. Exemplary IO, IO* lines are shown at 126, 128 in FIG. 4 respectively. Preferably, the IO, IO* lines are driven to a common first potential, and the common cell plate 119 is driven to a second potential which is different from the first potential. In one embodiment, the first potential is higher than the second potential. Of course, the opposite can be true as well without departing from the spirit and scope of the invention.

Referring to FIG. 11, a flow diagram describing various other embodiments of the present invention is shown generally at 500.

At 502, a memory array is provided and preferably includes a plurality of memory cells individually comprising a transistor and a capacitor. The capacitor has a cell plate and the individual transistors are capable of being activated by respective word lines. An exemplary layout is shown in FIG. 4. The memory array also includes a plurality of column select (CSel) lines, an exemplary one of which being shown at 124 in FIG. 4. A plurality of digit line pairs $D0_n$, $D0_n{}^*$, are provided, where n>1, and are respectively operably coupled with individual column select (CSel) lines for selection thereby.

At 504, the memory array is placed into a defect-identifying test mode by forcing the cell plate, at 506, into a first test state. At least some of the digit line pairs $D0_n$, $D0_n{}^{500}$, and preferably all of the digit line pairs, are forced, at 508, into a second test state which is different from the first test state. At 510, at least some of the word lines and the column select (CSel) lines are forced into a third test state which is different from the first test state. In one embodiment, all of the column select (CSel) lines are placed into the third test state at the same time. In another embodiment, the memory array comprises write circuitry, such as write circuitry 132 (FIG. 4), which is coupled with the digit line pairs for writing data into the memory cells. Placement of the memory array into the defect-identifying test mode comprises using the write circuitry to force the digit line pairs into the second test state. Preferably, the individual digit lines are coupled with the write circuitry through individual IO and IO* lines. The digit line pairs are preferably forced into the second test state through the IO and IO* lines.

Referring to FIG. 12, a somewhat high-level block diagram of a portion of a memory array is shown generally at 600.

Memory array portion 600 includes an array block 602 and an array block 604. Each array block includes a plurality of addressable memory devices which store data as described above. Each array block includes row decoders 606 and column decoders 608 (column decoder 608 is shown only for array block 604). A sense amp stripe 610 is provided and is coupled with both array blocks 602, 604. Sense amp stripe 610 includes sense circuitry which is used to sense the data which is stored on each array block. The sense amp stripe 610 is coupled with the respective array blocks via individual digit line pairs, exemplary ones of which being designated at D0, D0*, D1, D1*, and D2, D2*. An example of how such sense circuitry can operate is described above in connection with FIG. 6. A sense amp control circuit is provided at 612 and is operably coupled with sense amp stripe 610. Sense amp control circuit can also include the read/write circuitry which is used to read from and write to memory cells contained in each array.

In the illustrated example, seven input lines are provided from sense amp circuitry 612 into sense amp stripe 610: IO's 612a, equilibrate_A 612b, fire_NSA 612c, fire_PSA 612d, equilibrate_B 612e, ISO A 612f, and ISO B 612g. Line 612a represent the IO lines discussed above. Lines 612b and 612e enable equilibration of the digit lines prior to sensing operations being conducted. Line 612c and 612d are the respective lines which fire the sense amplifiers or initiate sensing operations as described above. ISO A line 612ƒ and ISO B line 612g are the lines which enable isolation of an associated array block A or B. Other lines can, of course, be provided.

Address decoder circuitry 614 is provided and is connected with column decode circuitry 608 and also with individual row address latches 616 and 618.

Inputs into sense amp circuitry 612 include lines 613a (Section_A), 613b (Section_B), 613c (equilibrate), 613d (digit_to_cell plate), 613e (global_Nsense_amp), and 613ƒ (global_Psense_amp). The section lines 613a and 613b enable individual array blocks to be accessed while excluding the non-accessed array block from sensing operations. Line 613c is the equilibration signal line. Line 613d is the single bus line in accordance with one or more embodiments of the invention which enable defect testing to take place. Lines 613e and 613ƒ provide signals which are utilized in connection with sensing operations.

In accordance with one embodiment of the invention, a defect identifying method is provided and is suitable for use in connection with a memory array having at least two array blocks of memory devices, e.g. 602, 604, sense circuitry 610 coupled with the array blocks for performing sensing operations of the array blocks, and isolation devices to selectively electrically isolate selected memory devices in one block of the array blocks during sensing operations of the other array block. The method preferably includes providing a defect test signal. Responsive to the defect test signal, the isolation devices are placed into a common test state in which none of the memory devices are isolated. With none of the memory devices being electrically isolated, a test state is passed into all of the array blocks.

In one embodiment, the memory array comprises address decoder circuitry 614 which is coupled with the array and configured to provide addresses of individual memory devices. Provision of the defect test signal comprises providing the defect test signal to the address decoder circuitry 614 and responsive thereto, activating all possible address combinations. Preferably, a common bus line 613d is provided between sense circuitry 610 and address decoder circuitry 614. Preferably, provision of the defect test signal comprises passing the signal over the common bus line 613d.

In another embodiment, a memory array comprises a pair of array blocks having individual memory devices. Sense circuitry is provided and coupled with the pair of array blocks and configured to selectively perform sensing operations on the array blocks. Isolation circuitry is provided and coupled with the array blocks. The isolation circuitry is preferably configured to selectively isolate one block while sensing operations are performed on the other block. Override circuitry is preferably provided and coupled with the isolation circuitry and configured to enable both blocks to be unblocked for defect testing. Exemplary isolation circuitry is discussed below in connection with FIG. 14. In one embodiment the override circuitry comprises a single bus line, with an exemplary bus line being shown at 613d in FIG. 12. In another embodiment, the memory array comprises address decoder circuitry which is configured to provide the addresses of individual memory devices within the array blocks. The override circuitry is preferably coupled with the address decoder circuitry and is configured to enable all addresses of the memory devices to be activated. Preferably the override circuitry also comprises a single bus line which is configured to carry a defect test signal to both the isolation circuitry and the address decoder circuitry.

Figure 13B:
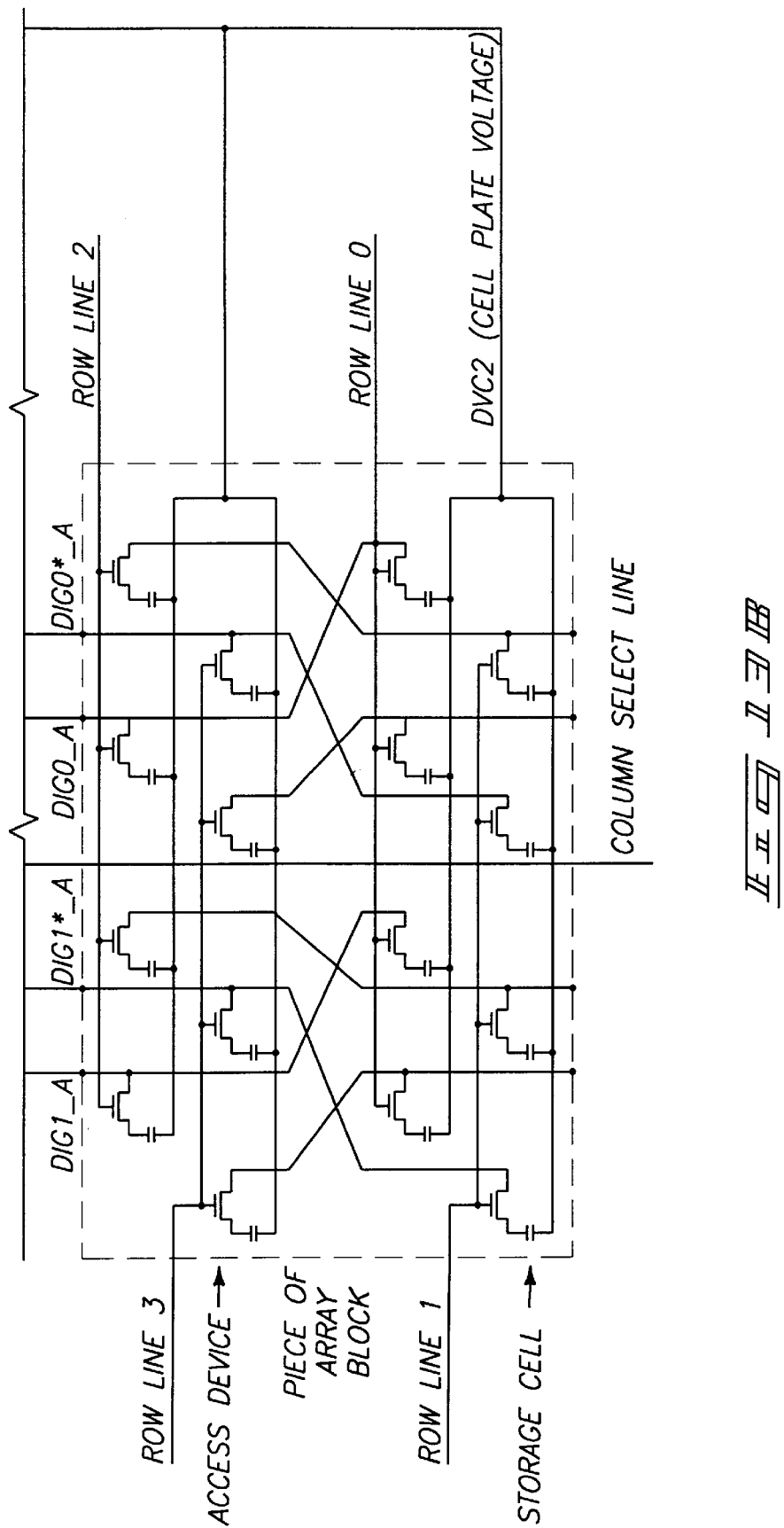
FIG. 13b is a view of a portion of array circuitry in accordance with one embodiment of the invention.

FIGS. 13, 13A and 13B show a portion of a schematic diagram of an array and its associated peripheral circuitry. FIG. 13A shows essentially the peripheral circuitry, while FIG. 13B shows the array.

Starting at the top of FIG. 13A, a number of lines feed into the peripheral circuitry. The first DVC2 line is the digit line equilibration signal line for an array block which is similar to the one shown in FIG. 13B and, if shown would be immediately above the top of the page upon which FIG. 13A appears. A companion DVC2 line appears at the bottom of the page and equilibrates the digit line voltages for the array of FIG. 13B. The line labeled "isolation device A" is an isolation device which effectively blocks out an array block when sensing operations are taking place on the array of FIG. 13B. Similarly, "isolation device B" is an isolation device which effectively blocks out the array of FIG. 13B when sensing operations are taking place on its companion array block. The complementary IO lines are shown for array block A and array block B at "array IO A", "array IO A*", and "array IO B", and array IO B*" respectively. The sense amplifier receives two lines designated "active pull up" and "Nsense pull down" which were discussed above.

In the test mode, the digit_to_cell_plate signal (line 613d in FIG. 12) goes active. This forces both isolation devices HIGH and turns off all EQUILIBRATE devices. No sections or blocks are active, thus both the Nsense and Psense are shut off and floated. All of the output of the address decoder 614 (FIG. 12) is forced such that all address combinations will be active and thus all column select (CSel) lines in the array will be active. The IO lines are held at Vcc with the digit_to_cell_plate testmode signal. This allows Vcc-Vth to be passed onto each digit line pair through the active column select (CSel) lines. DVC2 (FIGS. 13A and 13B) can then be grounded. Since the digit lines are at Vcc-Vth and isolated from the cell plate and the cell plate is grounded through the DVC2 line, the defect testing can take place at one time and in one step. This example is directed to placing the digit lines at Vcc (or near Vcc) and the cell plate at ground. One could, however, alter the circuitry to place any combination of voltages on the cell plate and digit lines which are suitable for defect testing.

FIG. 14 shows one exemplary preferred circuit embodiment of the above-described IO control circuitry or, in other embodiments, override circuitry. The illustrated example constitutes but one way of implementing suitable circuitry for defect testing in accordance with the various embodiments of the invention described above. Other circuits can, of course, be used.

A two-input NAND gate is operably coupled with a three-input NOR gate. The output of the NOR gate is connected through an inverter to four two-input NOR gates. The other inputs to the two-input NOR gates are either Data_In or the inverse of Data_In as provided by the illustrated inverters. The outputs of the two-input NOR gates are used to drive the illustrated transistors which enable the IO and IO* lines to be placed at a selected potential. This circuit comprises a write driver which is used to write data to the individual memory cells. If both the Write_Cmd and Section inputs to the two-input NAND gate are high, meaning that a particular section is active and being written to, and the array block is not being equilibrated (equilibrate input to the NOR is low) and we are not in a test mode (digit_to_cell_plate is low), the circuit enables the Data_In input to drive one of the IO lines high, while the other IO line is driven low. If, on the other hand, the test mode is active (e.g. digit_to_cell_plate is high), the circuit will force both IOs to go high.

In one alternative embodiment, one sense amp is provided for each array block. In such an embodiment, there is no need to isolate one array block from an adjacent array block having a shared sense amp stripe, because a separate sense amp is provided for each array block. For example, consider a single array block that has sense amplifiers coupled to it. In normal operation, it will still have one digit go high and the other will be pulled low. In accordance with the invention, both digits will be pulled to the same potential by turning the equilibrate signals on (ties digits together) and passing a voltage onto the digit line pair through the column select lines all being active. If this is done with the N and P sense amplifiers off, the cell plate is taken to a different potential for performance of the stress test.

Although the described embodiment uses full rail CMOS reference voltages (i.e. digits to VCC and to GND) for its normal and stress operations, in alternative embodiments combinations of different voltage potentials are used to achieve the same results.

Various embodiments of the invention can enable for defect testing to be done at one time and in one step. Various embodiments can also enable for defect testing to be done with circuitry that includes only one bus line which, in turn, saves on wafer real estate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of identifying defects in a memory array having at least one array block of memory devices and sense circuitry coupled to that array block for performing sensing operations from that array block, the array block having a pair of digit lines and having column select lines, the method comprising:

providing a defect test signal;

responsive to said defect test signal, coupling both digit lines of the pair together; and passing a voltage onto the pair of digit lines by activating all of the column select lines to perform a stress test.

2. The defect identifying method of claim 1, wherein the memory array includes address decoder circuitry coupled with the array block and configured to provide addresses of individual memory devices, and wherein the providing of the defect test signal further comprises providing said defect test signal to said address decoder circuitry and responsive thereto, activating all possible address combinations.

3. The defect identifying method of claim 2 further comprising providing a common bus line between the sense circuitry and the address decoder circuitry, and wherein the providing of the defect test signal comprises passing said signal over the common bus line.

4. A defect-identifying method in an array of memory cells comprising:

providing an array of memory cells having a plurality of complementary digit line pairs comprising individual digit lines $D0_n$, $D0_n^*$, where n>1, the complementary digit line pairs being configured to be placed into different states during sensing operations of the array, the array also having a cell plate electrode; and applying a defect-identifying signal to the array by driving the digit lines $D0_n$, $D0_n^*$ of at least one of the digit line pairs to a common test state, and the cell plate to another different test state with the use of only one dedicated bus line.

5. The defect-identifying method of claim 4, wherein the applying of the defect-identifying signal comprises driving a plurality of the complementary pairs of digit lines to said common test state.

6. The defect-identifying method of claim 4, wherein the applying of the defect-identifying signal comprises driving all of the complementary pairs of digit lines to said common test state.

7. The defect-identifying method of claim 4 further comprising providing read/write circuitry operably coupled to the plurality of complementary digit line pairs through individual respective $IO_M$ and $IO_M^*$ lines, where M>1, and wherein said driving of the digit lines of said at least one digit line pair comprises driving said one digit line pair through their respective $IO_M$ and $IO_M^*$ lines.

8. The defect-identifying method of claim 4 further comprising providing read/write circuitry operably coupled to the plurality of complementary digit line pairs through individual respective $IO_M$ and $IO_M^*$ lines, where M>1, and wherein said driving of the digit lines of said at least one digit line pair comprises driving a plurality of said digit line pairs through their respective $IO_M$ and $IO_M^*$ lines.

9. The defect-identifying method of claim 4 further comprising providing read/write circuitry operably coupled to the plurality of complementary digit line pairs through individual respective $IO_M$ and $IO_M^*$ lines, where M>1, and wherein said driving of the digit lines of said at least one digit line pair comprises driving all of said digit line pairs through their respective $IO_M$ and $IO_M^*$ lines.

10. The defect-identifying method of claim 4 further comprising:

providing write circuitry operably coupled to the plurality of complementary digit lines pairs through individual respective $IO_M$ and $IO_M^*$ lines, where M>1;

providing IO control circuitry operably coupled with the $IO_M$ and $IO_M^*$ lines; and wherein said driving of the digit lines of said at least one digit line pair comprises using said IO control circuitry to drive the IO and IO* lines to a common potential.

11. The defect-identifying method of claim 10, wherein said IO control circuitry comprises logic circuitry.

12. The defect-identifying method of claim 10, wherein said IO control circuitry comprises logic circuitry configured to receive a test mode signal and responsive thereto drive the IO and IO* lines to the common potential.

13. The defect-identifying method of claim 4 further comprising:

providing write circuitry operably coupled to the plurality of complementary digit lines pairs through individual respective $IO_M$ and $IO_M^*$ lines, where M>1, which are individually coupled to their respective digit lines through respective IO transistors; and wherein said driving of the digit lines of said at least one digit line pair comprises driving the $IO_M$ and $IO_M^*$ lines associated with said one digit line pair to a common potential and firing the IO transistors which are coupled with the digit lines of said one digit line pair.

14. The defect-identifying method of claim 4 further comprising:

providing write circuitry operably coupled to the plurality of complementary digit lines pairs through individual respective $IO_M$ and $IO_M^*$ lines, where M>1, which are individually coupled to their respective digit lines through respective IO transistors, the IO transistors being gated by individual column select lines; and wherein said driving of the digit lines of said at least one complementary digit line pair comprises driving the $IO_M$ and $IO_M^*$ lines associated with all of the complementary digit line pairs to a common potential and firing the IO transistors which are coupled with the digit lines of all of the digit line pairs by driving the column select lines to a common potential.

15. A defect-identifying method in an array of memory cells comprising:

providing a pair of memory cells, each having an access transistor and a capacitor, the capacitor having a cell plate;

providing write circuitry operably coupled with the pair of memory cells through respective individual input lines, the write circuitry being configured to write data into the memory cells; and imposing a defect-identifying condition on the array by placing the cell plate into a first test state, and, using the write circuitry, placing both of the input lines into a common second test state which is different from the first test state.

16. The defect-identifying method of claim 15, wherein the first test state comprises a first potential and the second test state comprises a second potential which is higher than the first potential.

17. The defect-identifying method of claim 15, wherein the input lines are respectively coupled with individual digit lines of a complementary digit line pair, and further comprising passing the second test state onto the individual digit lines.

18. The defect-identifying method of claim 17, wherein the input lines are coupled with the individual digit lines through respective pass transistors gated by a column select line, and wherein said passing comprises firing the column select line.

19. The defect-identifying method of claim 15 wherein:

the providing of the pair of memory cells comprises providing a plurality of pairs of memory cells;

the providing of the write circuitry comprises providing write circuitry operably coupled with the plurality of pairs of memory cells through a plurality of respective individual input lines;

the plurality of respective individual input lines being respectively coupled with individual digit lines of a plurality of complementary digit line pairs, and further comprising passing the second test state onto all of the individual digit lines.

20. The defect-identifying method of claim 19, wherein the input lines are coupled with their respective individual digit lines through respective pass transistors which are gated by individual column select lines, and wherein said passing comprises firing all of the column select lines.

21. The defect-identifying method of claim 15, wherein the imposing of the defect-identifying condition comprises firing word lines associated with the pair of memory cells during at least a portion of the time when the input lines are placed into the common second state.

22. A defect-identifying method in an array of memory cells comprising:

providing a plurality of memory cells, respective memory cells having an access transistor and a capacitor, the capacitor having a cell plate that is shared by all memory cells of the plurality of memory cells;

providing write circuitry operably coupled with the pair of memory cells through respective individual input lines, the write circuitry being configured to write data into the memory cells; and placing the cell plate into a first test state, and, using the write circuitry, placing both of the input lines of at least one memory cell into a common second test state which is different from the first test state.

23. A method of identifying defects in an array of memory cells, the method comprising:

providing a plurality of memory cells which are selectable by different column select lines; and driving the different column select lines to a common test state at the same time, wherein the memory cells comprise a common cell plate and are coupled to read/write circuitry through individual pairs of IO, IO* lines, and further comprising driving the IO, IO* lines to a common first potential and driving the common cell plate to a second potential which is different from the first potential.

24. The defect-identifying method of claim 23, wherein the first potential is higher than the second potential.

25. A defect-identifying method in an array of memory cells comprising:

providing a memory array having:

a plurality of memory cells individually comprising a transistor and a capacitor, the capacitor having a cell plate, individual transistors being capable of being activated by a word line;

a plurality of column select lines;

a plurality of digit line pairs $D0_n$, $D0_n^*$, where n>1, the digit line pairs being respectively operably coupled with individual column select lines for selection thereby;

placing the memory array into a defect-identifying test mode by:

forcing the cell plate into a first test state;

forcing at least some of the digit line pairs $D0_n$, $D0_n^*$, into a second test state which is different from the first test state; and forcing at least some of the word lines and the column select lines into a third test state which is different from the first test state.

26. The defect-identifying method of claim 25, wherein the forcing of the column select lines into the third test state takes place by placing all of the column select lines into the third test state at the same time.

27. The defect-identifying method of claim 25, wherein the memory array comprises write circuitry coupled with the digit line pairs for writing data into the memory cells, and wherein the placing of the memory array into the defect-identifying test mode comprises using the write circuitry to force the digit line pairs into the second test state.

28. The defect-identifying method of claim 27, wherein the digit line pairs are individually coupled to the write circuitry through individual IO and IO* lines, and wherein the digit line pairs are forced into the second test state through the IO and IO* lines.

29. A memory array comprising:

a pair of array blocks comprising individual memory devices;

sense circuitry coupled with the pair of array blocks and configured to selectively perform sensing operations on the array blocks;

isolation circuitry coupled with the array blocks and configured to selectively isolate one block while sensing operations are performed on the other block; and override circuitry coupled with the isolation circuitry and configured to enable both blocks to be unblocked for defect testing.

30. The memory array of claim 29, wherein the override circuitry comprises a single bus line configured to carry a defect test signal.

31. The memory array of claim 29, wherein the array comprises address decoder circuitry configured to provide the addresses of individual memory devices within the array blocks, and wherein the override circuitry is coupled with the address decoder circuitry and is configured to enable all addresses of the memory devices to be activated.

32. The memory array of claim 29, wherein the array comprises address decoder circuitry configured to provide the addresses of individual memory devices within the array blocks, and wherein the override circuitry is coupled with the address decoder circuitry and is configured to enable all addresses of the memory devices to be activated, and further wherein the override circuitry comprises a single bus line configured to carry a defect test signal to both the isolation circuitry and the address decoder circuitry.

* * * * *

UNITED STATES PATENT AND TRADEMARK OFFICE
CERTIFICATE OF CORRECTION

PATENT NO.   : 6,094,388
DATED        : July 25, 2000
INVENTOR(S)  : Timothy B. Cowles Page 1 of 1

It is certified that error appears in the above-identified patent and that said Letters Patent is hereby corrected as shown below:

Column 4,
Line 9, replace "DO" with -- D0 --.
Line 18, replace "DO" with -- D0 --.

Column 5,
Line 40, replace "NLAT" with -- NLAT* --.

Column 8,
Line 23, replace "$D0_n^{500}$," with -- $D0_n^*$, --.

Signed and Sealed this

Eighteenth Day of September, 2001

Attest:

Nicholas P. Godici

NICHOLAS P. GODICI
*Acting Director of the United States Patent and Trademark Office*

*Attesting Officer*